United States Patent
Droesbeke

(10) Patent No.: US 9,277,673 B2
(45) Date of Patent: Mar. 1, 2016

(54) CONNECTOR ASSEMBLY

(75) Inventor: Gert Droesbeke, Saint-Vit (FR)

(73) Assignee: FCI Asia PTE, Ltd., Singapore (SG)

(*) Notice: Subject to any disclaimer, the term of this patent is extended or adjusted under 35 U.S.C. 154(b) by 0 days.

(21) Appl. No.: 14/407,259

(22) PCT Filed: Jun. 12, 2012

(86) PCT No.: PCT/IB2012/001644
§ 371 (c)(1),
(2), (4) Date: Dec. 11, 2014

(87) PCT Pub. No.: WO2013/186587
PCT Pub. Date: Dec. 19, 2013

(65) Prior Publication Data
US 2015/0125118 A1  May 7, 2015

(51) Int. Cl.
G02B 6/36 (2006.01)
H05K 7/20 (2006.01)
G02B 6/42 (2006.01)
H04B 10/40 (2013.01)
G02B 6/38 (2006.01)
H01R 13/627 (2006.01)

(52) U.S. Cl.
CPC .......... *H05K 7/20154* (2013.01); *G02B 6/4219* (2013.01); *G02B 6/4269* (2013.01); *G02B 6/4292* (2013.01); *H04B 10/40* (2013.01); *G02B 6/3885* (2013.01); *G02B 6/3893* (2013.01); *H01R 13/6275* (2013.01)

(58) Field of Classification Search
CPC .. G02B 6/4204; G02B 6/4214; G02B 6/4219; G02B 6/423; G02B 6/4246; G02B 6/4249; G02B 6/4269; G02B 6/4292; G02B 6/43
USPC ......................................... 385/88, 89, 92, 93
See application file for complete search history.

(56) References Cited

U.S. PATENT DOCUMENTS

| 6,860,750 B1* | 3/2005 | Wu ............................... 439/358 |
| 2004/0077207 A1 | 4/2004 | Ice ................................ 439/357 |
| 2010/0081303 A1* | 4/2010 | Roth et al. .................... 439/140 |

FOREIGN PATENT DOCUMENTS

JP    58-058510    4/1983

* cited by examiner

*Primary Examiner* — Ryan Lepisto
(74) *Attorney, Agent, or Firm* — Harrington & Smith

(57) ABSTRACT

A connector assembly of a first connector and a second connector. The connector assembly includes at least one latch biased to a locking position to lock the assembly in cooperation with a complementary locking section. The connector assembly includes a release member movable in a direction towards a top face of one of the connectors from a rest position to a release position. The release member pushes the latch away from the locking position when the release member is moved to the release position.

20 Claims, 7 Drawing Sheets

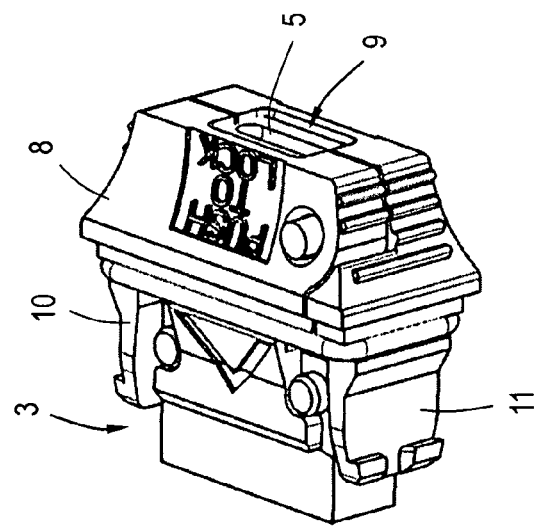
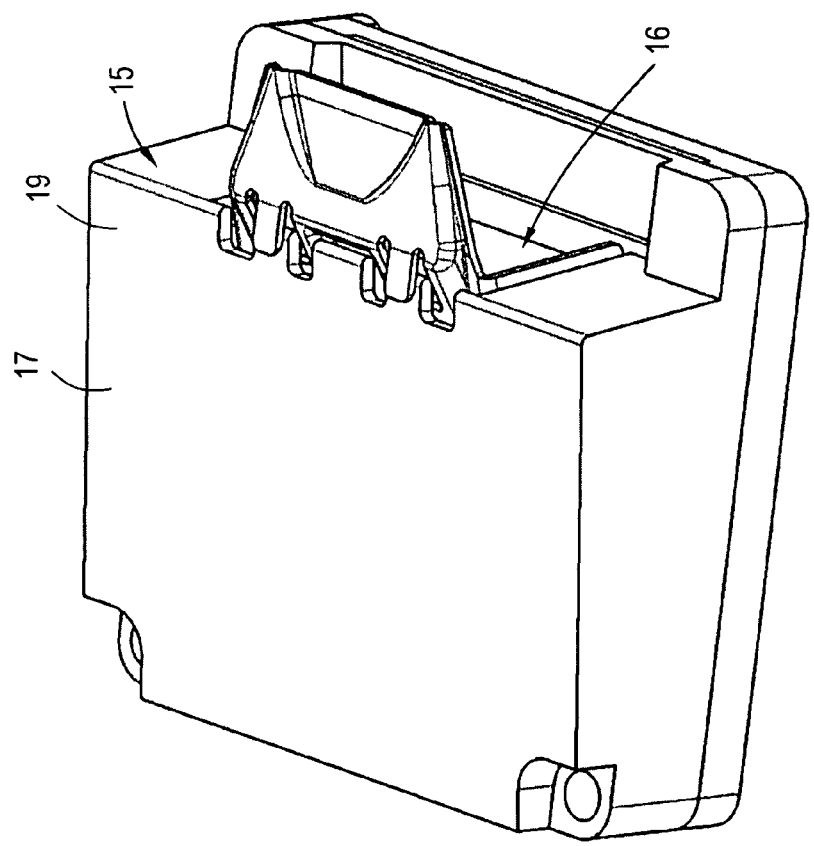
Fig.2

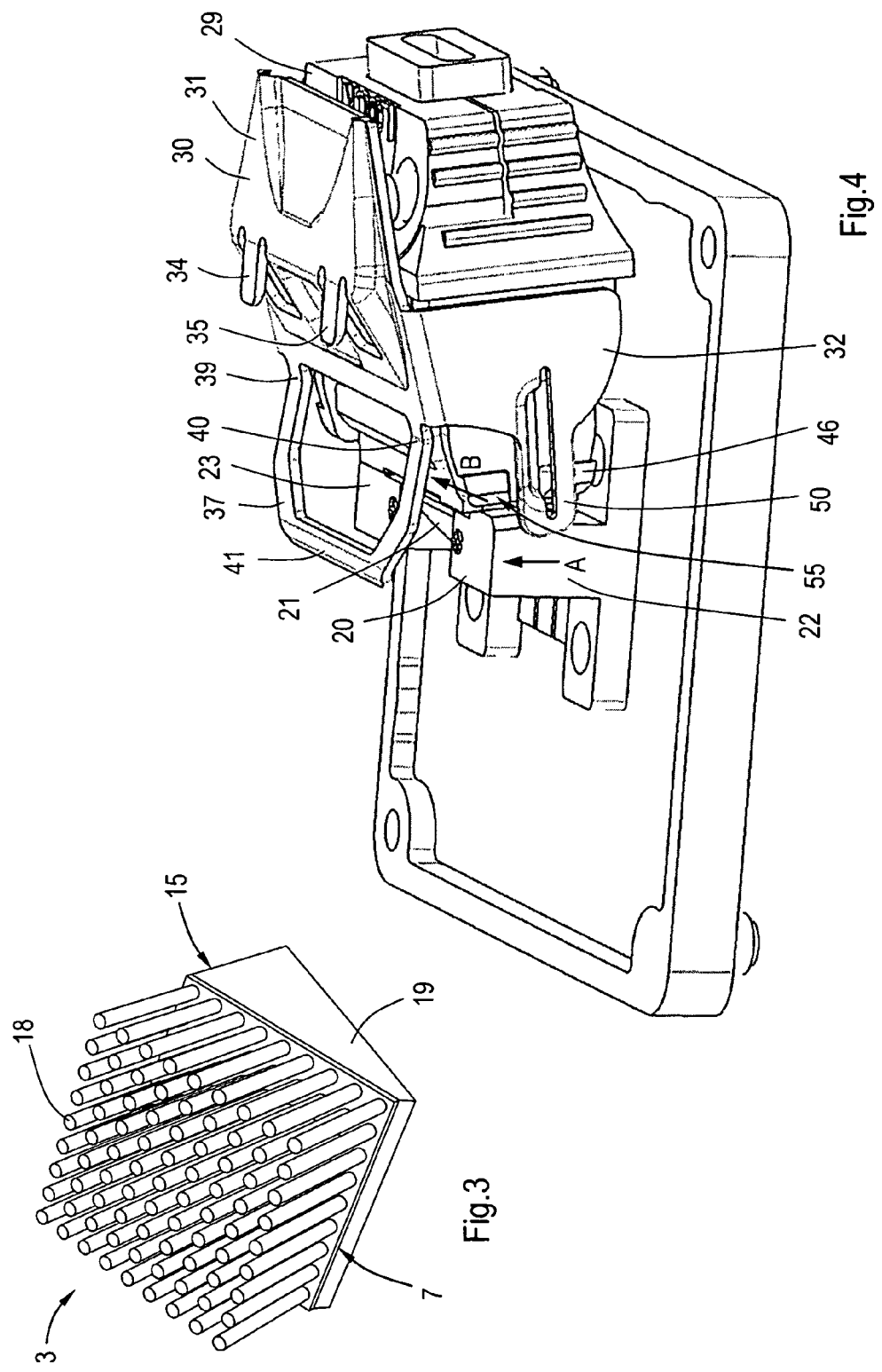

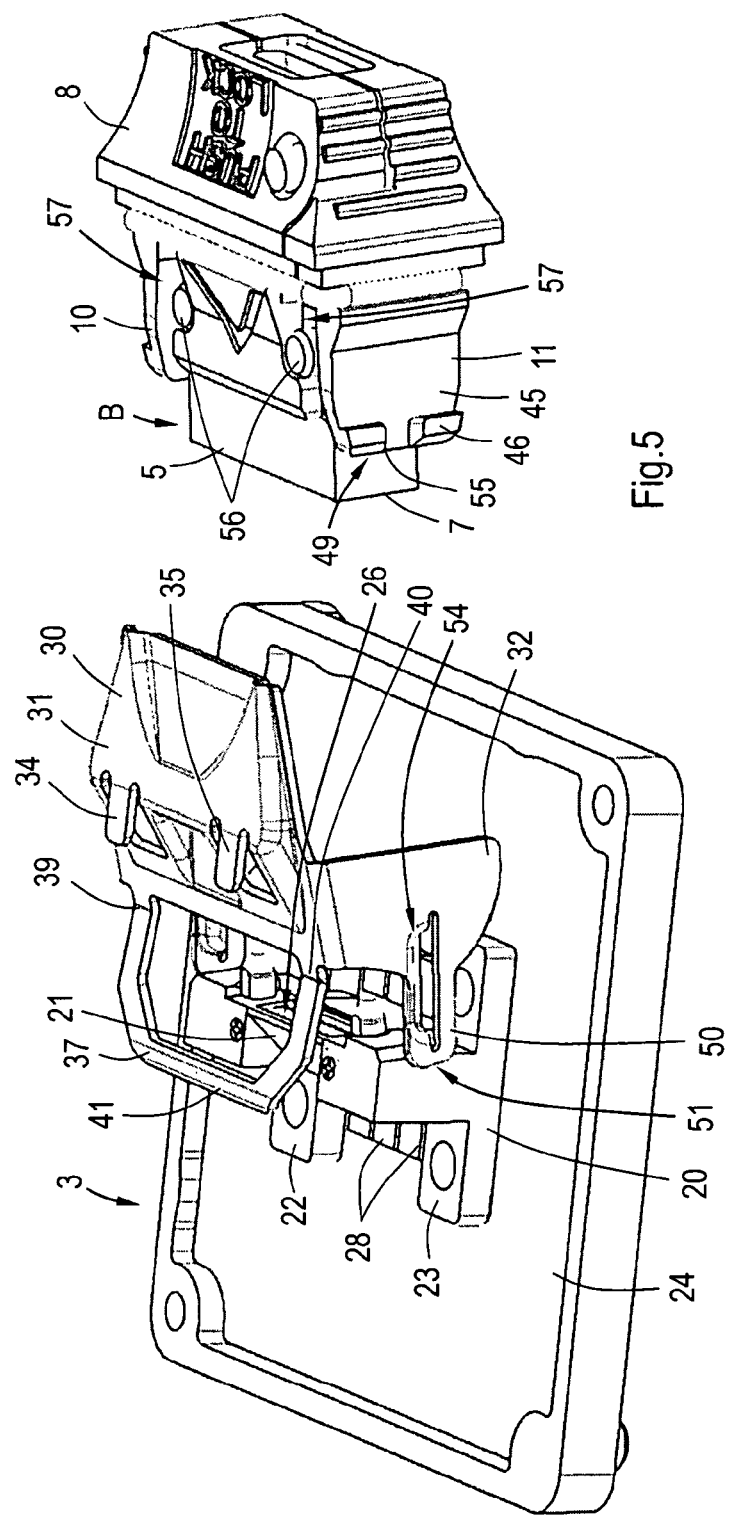

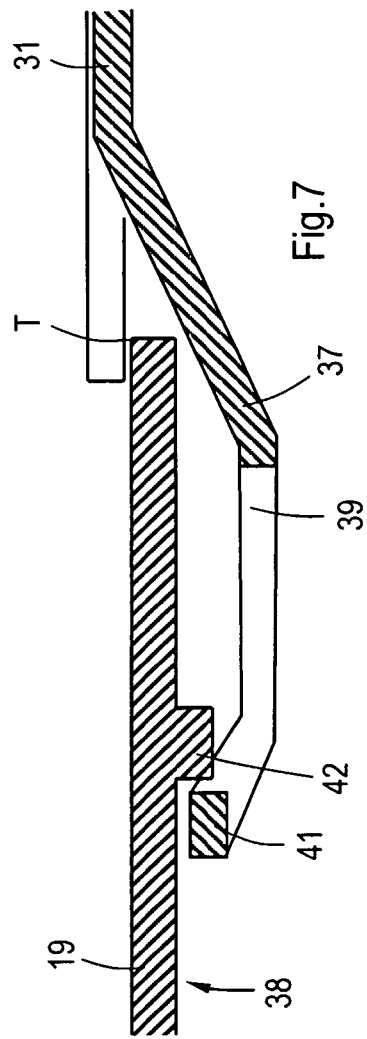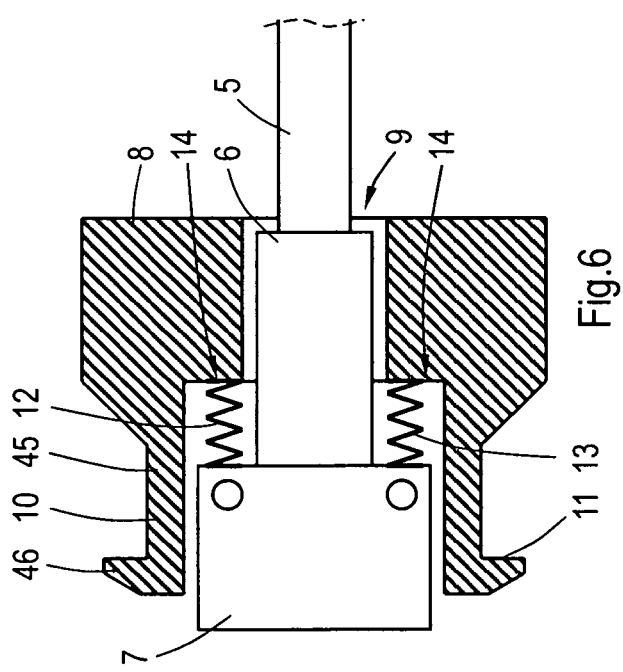

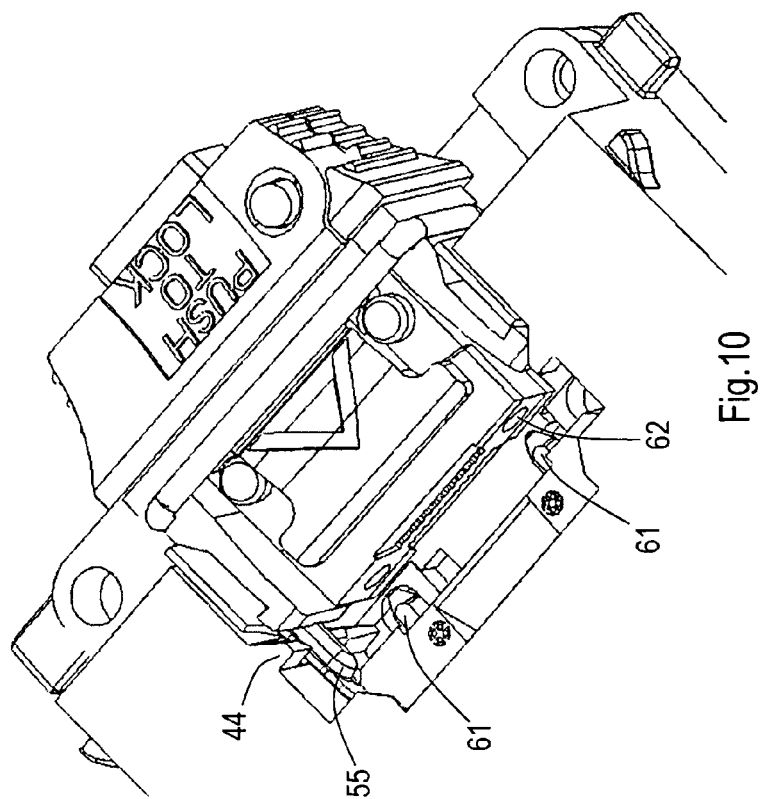
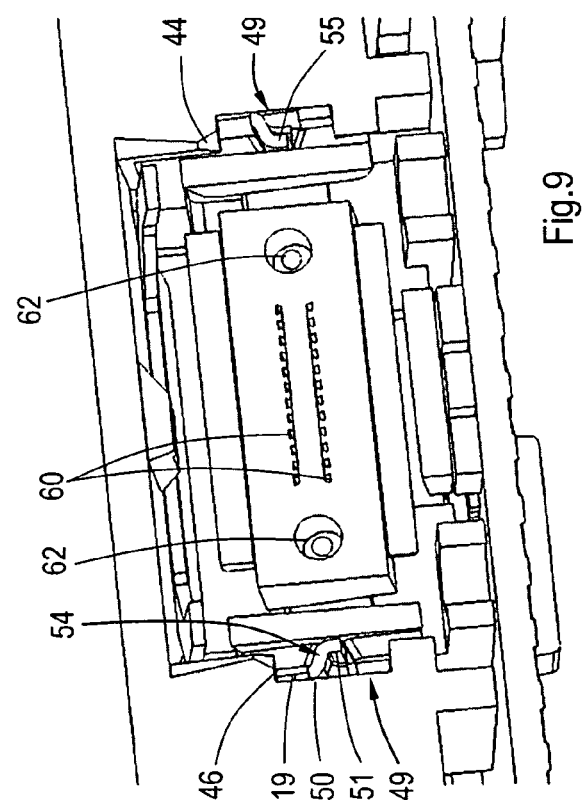
Fig.10
Fig.9

CONNECTOR ASSEMBLY

FIELD OF THE DISCLOSURE

The present invention relates to a connector assembly of two or more complementary connectors comprising a latch and a release member.

BACKGROUND OF THE DISCLOSURE

Such connector assemblies are for instance used to connect optical cables to a transceiver. Optical cables can be connected to printed circuit boards or similar substrates using transceivers and cable assemblies which can be plugged into a complementary opening in the transceiver. The transceiver is typically received by a socket assembly mounted on the substrate. The cable assembly should be accurately positioned within the transceiver in order to assure that the terminal end of each fiber faces an associated light receiving lens in the transceiver with a gap of a predetermined distance between the two. The optical signals pass the transceiver and are converted to electronic signals. The transceivers can for example be provided with a heat sink to dissipate heat generated during use.

Although unintentional decoupling of the cable assembly should be avoided, the cable assemblies must provide the possibility of removal. To this end, the cable assemblies are generally provided with a lock and a release member to unlock the lock, typically by manual actuation. Accessibility of such an actuator for unlocking requires sufficient space around the cable assembly. This requirement reduces the possible density of the transceivers on a board.

It is an object of the present invention to provide a lockable and releasable connector allowing a high density of transceiver positions on a substrate. It is a further object of the invention to provide a connector allowing increased heat dissipation from an associated transceiver.

SUMMARY OF THE DISCLOSURE

A connector assembly is disclosed comprising a first connector and a second connector, the connector assembly comprising at least one latch biased to a locking position to lock the assembly in cooperation with a complementary locking section. The connector assembly comprises a release member movable in a direction towards a top face of one of the connectors from a rest position to a release position. When the release member is moved to the release position the release member pushes the latch away from the locking position. In this respect, the top face of the connector is the surface that does not face other connector assemblies when the assemblies are arranged in a row. Hence, actuation of the release member does not require additional finger space and it is not required anymore to grip around the plugged connector to apply a pinching or squeezing action for releasing the connector. Neighboring connector assemblies on the same substrate can be put closer together and a higher connector density can be achieved.

In a specific embodiment the release member can comprise a contact face engaging the latch, the contact face being shaped to gradually push the latch in a direction under an angle with the direction of movement of the contact face. The moving direction of the contact face of the release member and the moving direction of the latch can for example be substantially orthogonal. Unlocking the latch moves the release member in a different direction than the latch. For instance, a vertical movement of the contact face of the release member causes a lateral unlocking movement of the latch, both movements being under right angles with a mating direction, which is the direction of movement of the first connector relative to the second connector during assembling.

In a specific embodiment the second connector comprises a receiving opening for receiving a pluggable end of the first connector. The release member can comprise an actuating portion extending adjacent the receiving opening. Such an actuating portion can for instance extend over the top face of the first connector. The actuating portion can be pivotably coupled to an adjacent front edge of a top face of the second connector. Pivoting the actuating portion towards the top face of the first connector moves the contact face of the release member to the release position. Such an actuating portion is easily accessible for a user. By pushing down the actuating portion, the release member pivots and unlocks the latches.

In a more specific embodiment, the release member may comprise a lever extending from the pivoting axis into the receiving opening and resiliently abutting an inner surface of the second connector. This way, the lever biases the release member to a locking position, reducing the risk of unintentional unlocking. Such a lever can for instance be a C-shaped element with two ends connected to the actuating portion and a middle portion upwardly offset from the two connected ends in a resilient manner. The middle portion can for instance hook behind a projection of the abutting inner surface of the second connector to prevent disassembly without actuating the release member.

The release member can be designed in such a way that the second connector comprises an uninterrupted top face, which can be fully used for heat dissipation. To maximize heat dissipation, the top face can be covered, e.g., fully covered by a heat sink.

Accessibility of the receiving opening is further improved if the side of the second connector with the receiving opening slopes backwardly.

In a specific embodiment, the cable connector can comprise at least one spring forcing the first and board connector apart against the action of the one or more latches. The springs push the two connectors apart as soon as the release member pushes the latches aside. This facilitates easier disassembling further reducing the need for grip space to pull the released connector.

The first connector can for example be a cable connector, e.g., comprising a cable holder with a terminal end held in a ferrule, a casing holding the cable holder slideable in a mating direction, the casing carrying a latch at either lateral side of the ferrule, the casing having an inner surface around a passage for the cable holder, wherein compression springs are symmetrically arranged between said inner surface and an opposite face of the ferrule.

The contact face can for instance be a bulging face acting against a counter surface at a lateral side of the respective latch. Optionally, the contact surface of the latch is positioned at a lateral surface in an interruption of the latch. The contact surface can for example be a side face of a locking cam of the latch.

The first connector can for example be a cable connector, such as an optical cable connector. The second connector can for example be a board connector, such as a transceiver, on a substrate, such as a circuit board, wherein the release member is movable in a direction towards the substrate from its rest position to its release position.

Alternatively, the connector assembly can for instance be an electrical connector assembly with a header connector, such as an electrical cable connector, and a receptacle cable connector or on-board connector.

The invention also relates to an optical cable connector and to a transceiver for use in the disclosed connector assembly.

BRIEF DESCRIPTION OF THE DRAWINGS

An exemplary embodiment of the connector will be further explained under reference to the accompanying drawing.

FIG. 2: shows the assembly of FIG. 1 in a disconnected state;

FIG. 3: shows the transceiver of FIG. 1 with a heat sink;

FIG. 4: shows the assembly of FIG. 1 without the housing of the transceiver;

FIG. 5: shows the assembly of FIG. 1 in exploded view without the housing of the transceiver;

FIG. 6: shows the cable holder of the cable connector of FIG. 1 in cross section;

FIG. 7: shows in cross section part of the inner surface of the transceiver;

FIG. 9: shows a front view of the cable connector of the assembly of FIG. 1 after connection with the board connector;

FIG. 10: shows the connector of FIG. 8 during assembly.

DETAILED DESCRIPTION OF EMBODIMENTS

Figure 1:
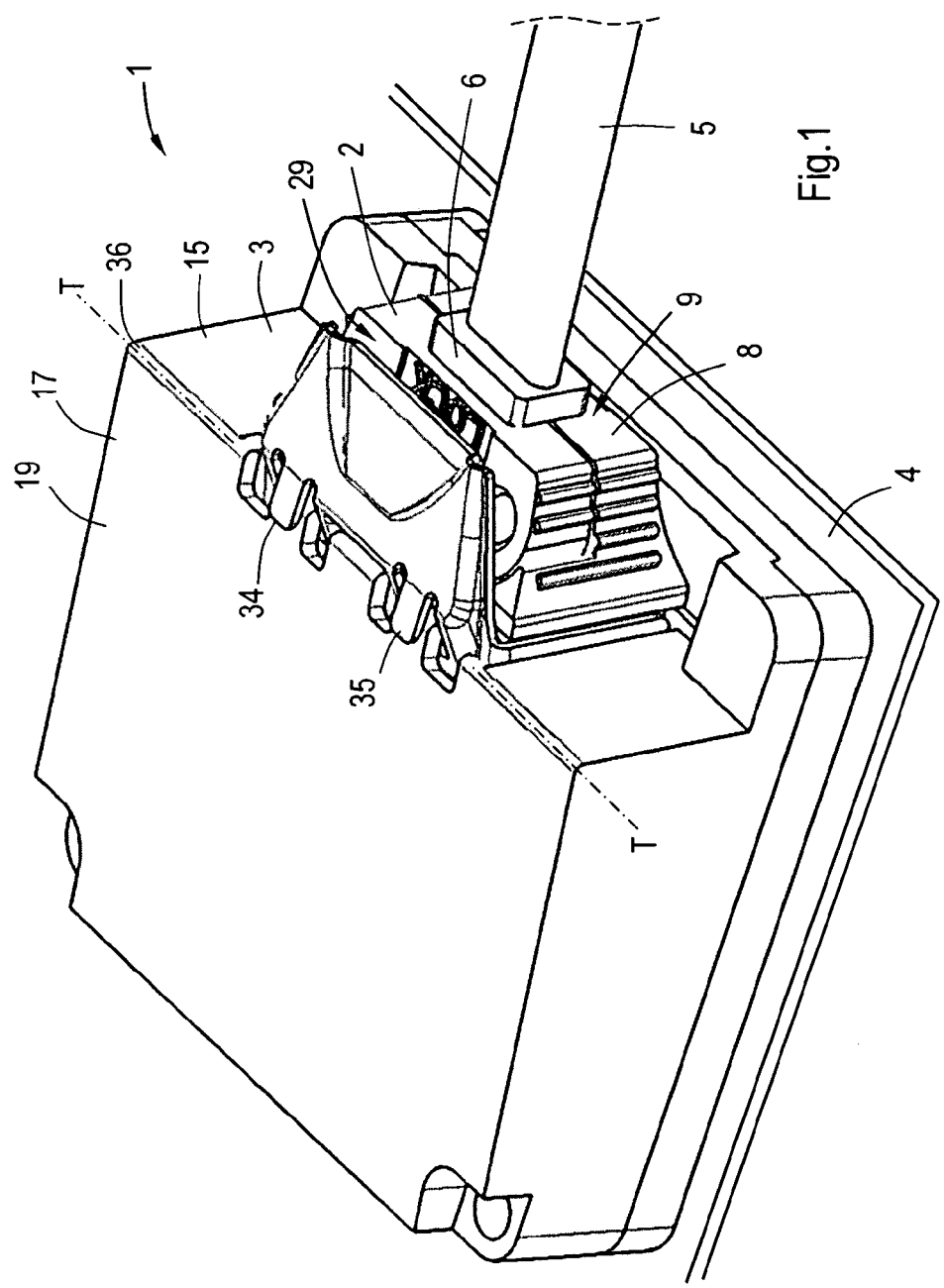
FIG. 1: shows a connector assembly with an optical cable and a transceiver in perspective view.

FIG. 1 shows an assembly 1 of an optical cable connector 2 and a transceiver 3 receiving a pluggable end of the cable connector 2. The transceiver 3 is a board connector positioned on a printed circuit board or a similar substrate 4. The optical cable connector 2 holds the terminal end of an optical cable 5 in a cable holder 6 shown in more detail in FIG. 6.

One end of the cable holder 6 is held in a ferrule 7 where terminal ends 60 of optical fibers running through the cable 5 are accurately arranged according to a desired pattern (FIG. 9). A casing 8 holds the cable holder 6 in a sliding manner. The casing 8 comprises a cable holder passage 9. In the assembled state as shown in FIG. 1 the cable holder 6 projects from the cable holder passage 9. In the disassembled state (see FIG. 2) the end of the cable holder 6 is retracted within the cable passage 9.

The casing 8 carries a latch 10, 11 at both lateral sides of the ferrule 7 in a symmetrical lay-out. In an alternative embodiment, the casing 8 may comprise an asymmetrical lay-out or at least have one or more asymmetrically arranged features in such a way that the cable connector 2 can be connected to the cable connector 2 in only one single orientation in order to prevent misalignment of the contacts of the two connectors 2, 3.

The casing 8 has an inner surface around the cable holder passage 9. Two symmetrically arranged compression springs 13, 14 (see FIG. 6) are held between the inner surface of the casing 8 and the facing end of the ferrule 7. The compression springs 13, 14 force the ferrule 7 and the inner surface of the casing 8 apart, moving the cable holder 6 to the retracted position when the connector assembly 1 is in a disassembled state (see FIG. 2).

The transceiver 3 comprises a thermoconductive shielding or housing 19 with a backwardly inclined front face 15 with a receiving opening 16. The housing 19 comprises a flat and uninterrupted top face 17 sloping upwardly in the direction of the receiving opening 16. The top face 17 can be covered with a heat sink 18, as for example is shown in FIG. 3.

FIGS. 4 and 5 show the interior of the transceiver 3. The transceiver 3 houses an optic coupling device 20 with an optic prism 21 between two supports 22, 23 fixed to the substrate 24. The prism 21 comprises a triangular cross section with a front surface 26 facing the cable connector 2 in the assembled condition of the connector assembly and a horizontal lower surface operatively connected to transducer elements 28 below the prism 21, which convert optical signals to electronic signals. The front surface 26 is parallel to the opposite surface of the ferrule 7 and is provided with lenses (not shown), each lens facing an associated terminal end of an optical fiber of the cable 5.

The transceiver 3 further comprises a release member 30 with an actuating portion 31 extending over a top face 29 of the cable connector 2 and two downwardly projecting legs 32 at either side of the actuating portion 31. The actuating portion 31 and the legs 32 frame the upper and side edges of the receiving opening 16 of the transceiver 3. The distance between the legs 32 is sufficient to receive the cable connector 2. The actuating portion 31 comprises two hooks 34, 35 coupled to the upper edge 36 of the receiving opening 16. The hooks 34, 35 allow pivoting of the release member 30 about a pivoting axis T (see FIG. 1). This way, the release member 30 can be pivoted in the direction of the top face 29 of the connector 2. When the release member 30 is pivoted down the release member 30 is in the release position, as will be explained herinafter.

The pivoting movement is limited by a lever 37 extending from the pivoting axis T into the receiving opening 16 and resiliently abutting an inner surface 38 of the transceiver 3 (see FIG. 7). The lever 37 is a C-shaped element with two ends 39, 40 connected to the actuating portion 31, and a middle portion 41 upwardly offset from the two connected ends 39, 40 in a resilient manner. The middle portion 41 of the C-shaped lever 37 hooks behind a projection 42 of the abutting inner surface 38 of the transceiver 3 (see FIG. 7). When the actuating portion 31 is pushed down by a user, the lever 37 pivots upwardly and pushes against the inner surface 38 of the transceiver. The lever 37 generates a resilient counter force, biasing the release member 30 to the rest position.

Figure 8:
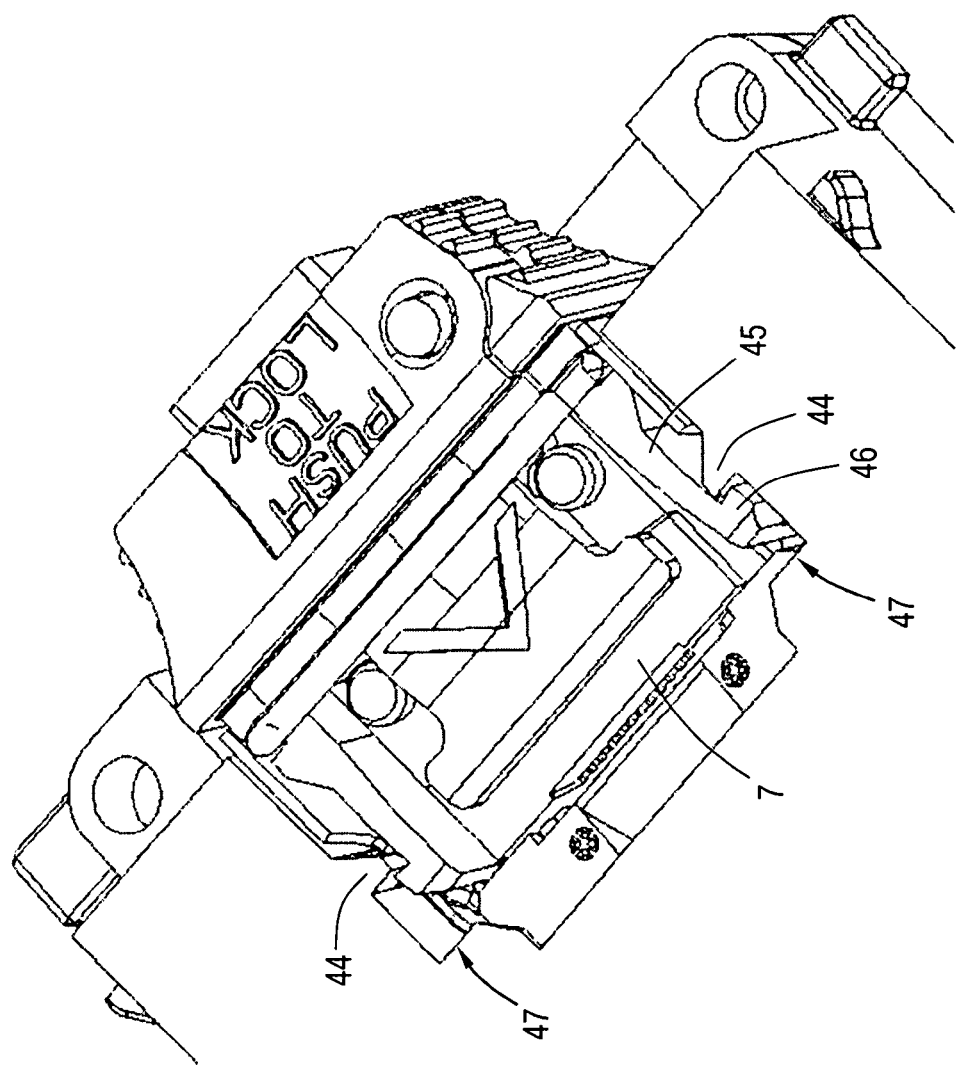
FIG. 8: shows in perspective view the latches of the assembly of FIG. 1 engaging complementary locking sections.

The latches 10, 11 of the cable connector 2 comprise a backbone 45 and a locking cam 46 pointing away from the ferrule 7. In the assembled condition the locking cam 46 partly hooks behind a ridge 44 bordering a recess 47 in the housing 19 of the transceiver 3 (see FIG. 8). In its middle part the cam 46 of the latch 10, 11 is interrupted by a recess 49 (FIGS. 5 and 9).

Both legs 32 of the release member 30 comprise an arm 50 extending in a direction parallel to the lever 37. In the assembled condition the outer end 51 of the arm 50 is positioned in the interrupting recess 49 of the locking cam 46 (see FIG. 9). The arm 50 is stamped to form an inwardly bulging contact face 54. The bulging contact face 54 abuts a side face 55 of the locking cam 46 in the interrupting recess 49.

Pushing the actuating portion 31 will pivot the release member 30 against the spring action of the lever 37. The pivoting movement will move the arms 50 upwards (arrow A in FIG. 4) and will push the bulging contact face 54 against the side face 55 of the locking cam 46. The arms 50 are supported by the inner wall of the housing 19 to prevent that the latches push the arms 50 aside (see FIG. 9).

Due to the shape of the contact face 54 the upward movement of the arm 50 will bent the latch in a lateral direction (arrow B in FIG. 4). This way, the direction of movement of the contact face 54 is substantially perpendicular to the direction of movement of the respective latch 10, 11. As shown in FIGS. 9 and 10, the ridge 44 stops at a sufficient distance from the recess 49 in the locking cam 46 in order not to hinder upward movement of the contact face 54 of the arm 50 of the release member 30.

When the cam 46 of the latch 10, 11 is bent away from the cooperating recess 47, the latch is unlocked. The compression springs 13, 14 are now allowed to relax and push the casing 8 away from the ferrule 7 over a distance limited by stops 56 on the ferrule 7 slideable via respective slots 57 of the casing 8 (see FIG. 5). The user can then release the actuating portion 31. The lever 37 will push the release member back to its original position. Since the casing 8 is already pushed backwardly by the compression springs, the latches 10, 11 remain unhooked and the cable connector 2 can be taken away.

For accurate alignment of the fiber ends 60 of the cable connector 2 relative to lenses of the front face 26 of the optical coupling device 20, the coupling device is provided with alignment pins 61 cooperating with matching alignment channels 62.

The side faces 55 of the interruption 49 of the latch cams 46 and the contact faces 54 at the outer ends of the arms 50 of the release member 30, can be shaped and dimensioned to form a guide for accurately pre-aligning the cable connector 2 before the alignment pins 61 enter the respective alignment channels 62.

The invention claimed is:

1. A connector assembly of a first connector and a second connector, the connector assembly comprising at least one latch biased to a locking position to lock the assembly in cooperation with a complementary locking section, the connector assembly comprising a release member movable in a direction towards a top face of one of the connectors from a rest position to a release position, wherein the release member pushes the latch away from the locking position when the release member is moved to the release position, wherein a contact face is a bulging face of an arm of the release member acting against a counter surface at a lateral side of the respective latch, and wherein a contact surface of the latch is positioned at a lateral surface in an interruption of a cam of the latch.

2. A connector assembly according to claim 1 wherein the release member comprises a contact face engaging the latch, wherein the contact face is shaped to gradually push the latch in a direction under an angle with the direction of movement of the contact face.

3. A connector assembly according to claim 2 wherein the moving direction of the contact face of the release member and the moving direction of the latch are substantially orthogonal.

4. A connector assembly according to claim 3, wherein the side of the second connector with a receiving opening slopes backwardly.

5. A connector assembly according to claim 1, wherein the second connector comprises a receiving opening for receiving the first connector and wherein the release member comprises an actuating portion extending adjacent the receiving opening.

6. A connector assembly according to claim 5 wherein the actuating portion extends over the top face of the first connector and wherein the actuating portion is pivotably coupled to an adjacent front edge of a top face of the second connector, and wherein pivoting the actuating portion moves the release member to the release position.

7. A connector assembly according to claim 6 wherein the release member comprises a lever extending from the pivoting axis into the receiving opening and resiliently abutting an inner surface of the second connector.

8. A connector assembly according to claim 7 wherein the lever is a C-shaped element with two ends connected to the actuating portion and a middle portion upwardly offset from the two connected ends.

9. A connector assembly according to claim 8 wherein the middle portion hooks behind a projection of the abutting inner surface of the second connector.

10. A connector assembly according to claim 1 wherein the second connector comprises a top face covered with a heat sink.

11. A connector assembly according to claim 1 wherein the first connector comprises at least one spring forcing the first connector and the second connector apart against the action of the one or more latches.

12. A connector assembly according to claim 11 wherein the first connector is a cable connector comprising a cable holder held in a ferrule, a casing holding the ferrule slideable in a mating direction, the casing carrying a latch at either lateral side of the ferrule, the casing having an inner surface around a passage for the cable holder, wherein the springs are symmetrically arranged compression springs between said inner surface and an opposite face of the ferrule.

13. A connector assembly according to claim 1 wherein the release member comprises at least one arm with a contact face engaging the latch, wherein the contact face is shaped to gradually push the latch away from the locked position, wherein the arm is supported by an inner wall of the housing of the second connector.

14. A connector assembly according to claim 1 comprising a symmetrical arrangement of two latches and associated contact faces of the release member, wherein both latches extend at a respective lateral side of the first connector.

15. A connector according to claim 1 wherein the first connector and the second connector comprise asymmetrically arranged features allowing a single relative orientation of the two connectors when assembled.

16. A connector according to claim 1 wherein the release member comprises a contact face engaging a counter contact face of the latch, wherein the contact face and the counter contact face are configured to form a guide for aligning the first connector during insertion into the second connector.

17. A connector assembly according to claim 1 wherein the first connector is a cable connector and the second connector is a board connector on a substrate, wherein the release member is movable in a direction towards the substrate from its rest position to its release position.

18. A connector assembly according to claim 17 wherein the cable connector is an optical cable connector and the board connector comprises a transceiver.

19. An optical cable connector for use in the connector assembly of claim 18.

20. A board connector for use in the connector assembly of claim 18.

* * * * *